United States Patent [19]
Kurtzberg et al.

[11] Patent Number: 5,822,719
[45] Date of Patent: Oct. 13, 1998

[54] PERFORMANCE-CONSTRAINED COMPONENT SELECTION

[75] Inventors: Jerome M. Kurtzberg; Menachem Levanoni, both of Yorktown Heights, N.Y.

[73] Assignee: International Business Machines Corporation, Armonk, N.Y.

[21] Appl. No.: 901,002

[22] Filed: Jul. 25, 1997

[51] Int. Cl.$^6$ .............................. G06F 9/455; G05B 13/00
[52] U.S. Cl. ............................. 702/182; 705/7; 711/100; 364/578
[58] Field of Search ................ 364/551.01, 550, 364/578, 148, 149, 152, 153, 488, 489, 490, 491; 705/7, 8; 711/1, 100; 702/182

[56] References Cited

U.S. PATENT DOCUMENTS

| | | | |
|---|---|---|---|
| 4,744,028 | 5/1988 | Karmarkar | 364/402 |
| 5,216,593 | 6/1993 | Dietrich et al. | 345/467 |
| 5,469,367 | 11/1995 | Puri et al. | 364/489 |
| 5,523,960 | 6/1996 | Jeong | 364/578 |
| 5,548,518 | 8/1996 | Dietrich et al. | 364/468.06 |
| 5,557,531 | 9/1996 | Rostoker et al. | 364/489 |
| 5,630,070 | 5/1997 | Dietrich et al. | 705/8 |

OTHER PUBLICATIONS

Park et al., "Partioning for Minimal Memory in Hardware–Software Codesign", 1996 IEEE International Symposium on circuits and Systems, May 12, 1996.

*Primary Examiner*—John E. Barlow, Jr.
*Assistant Examiner*—Patrick Assouad
*Attorney, Agent, or Firm*—Whitham, Curtis & Whitham; Stephen C. Kaufman

[57] ABSTRACT

Apparatus and methodology solve a performance-constrained component selection problem. The method includes articulating a set of constraints comprising inter alia specifying particular processes to be performed in relation to an end-task, and comprising time, cost, and functional unit constraints, and, determining a minimal-cost implementation of the functional units which realize the processes and satisfies the constraints.

2 Claims, 2 Drawing Sheets

PROCESS P1

PROCESS P2

PROCESS P1

PROCESS P2

PERFORMANCE-CONSTRAINED COMPONENT SELECTION

FIELD OF THE INVENTION

This invention relates to apparatus and methodology for addressing a performance-constrained component selection problem.

BACKGROUND OF THE INVENTION

This invention deals with a problem of selecting a minimal cost set of components (e.g., arithmetic units, flip-flops, memory units, etc.) for implementing a system subject to given performance conditions.

SUMMARY OF THE INVENTION

Preliminarily, we note that while the methodology disclosed in this invention is applicable to a general class of component selection problems in a variety of system design applications, we address (for the sake of pedagogy) a specific problem comprising an implementation of registers in computers. A statement of this problem is articulated shortly below, and is referenced to the following (5) constraints:

(1) A set of registers required for the computer under design.

(2) For each of the registers, a list of possible hardware implementations.

(3) For each of the implementations, cost, and performance measures (running or delay times of the components).

(4) A set of processes, each one designated by a graph representing the register transfer flow of information. The nodes of the graph represent the names of the registers used by the process and the branches represent the flow path from register to register. Multiple branches implies simultaneous parallel routs of flow for the process.

(Note that the graph can be replaced by a sequence of names of registers, and is so regarded in the formulation of the problem, infra. The rules for the transformation are as follows. If there are no multiple branches from a node, then the successor node (register) is listed separated by a comma from the preceding node. Multiple branches from a node are represented by enclosing by parentheses the alternate flow paths prior to their merging to a common node, and within the parentheses, separating by a semi-colon the subsequences of nodes in each alternative path. For example, see the illustrative graph in FIG. 1, numeral 10.)

(5) For each process, an associated time bound for its completion. The running time, or delay, of the process is given by the sum of the delays of the nodes (registers) outside of the parentheses plus, within the parentheses, the maximum of the sum of the delays of each subsequence separated by semi-colon. More generally, other design applications call for different delay functions according to the process being modeled. For example, in communication systems, where the nodes represent message processing units, the minimum of the sum of the delays, rather than the maximum, would be an appropriate delay function for the subsequence inside the parentheses. The interpretation then is that the process is satisfied if a message is received via any branch rather than over all multiple (parallel) branches. See FIG. 1.

Our problem, then, as referenced to the cited (5) constraints, is the following:

Find the minimum cost register implementation subject to the condition that each process, according to its register usage, can be completed within its time bound.

We believe our problem to be uniquely posed, with reference to the prior art, and to be solved, in a first aspect, by a digital computer dedicated to solving a performance-constrained component selection problem, the computer comprising:

1) means for inputting to a central processing unit information comprising:

(1) a matrix $M=(M_{ij})$, where each row represents a functional unit, and the elements of each row designate a specific implementation of the functional unit;

(2) a cost function $C(M_{ij})$ defined on each element of M;

(3) a performance time delay function $E(M_{ij})$ defined on each element of M;

(4) a set of processes $P_1, P_2, \ldots, P_s$, where each $P_k$ comprises a sequence of functional units, thereby defining a subsequence of row in M;

(5) a set of time tolerances $t_1, t_2, \ldots, t_s$, associated with the s processes;

2) means for selecting in the central processing unit exactly one element out of each row of M, such that $\Sigma (C(M_{ij}))$ is minimal over selected elements of M, subject to $\Sigma (E(M_{ij})) \leqq \mp t_k$, $k=1, 2, \ldots, s$ over selected elements in rows contained in Pk; and 3) means for displaying the information corresponding to the one element.

In a second aspect, the invention discloses a program storage device readable by a machine, tangibly embodying a program of instructions executable by the machine to perform method steps for performance-constrained component selection, said method steps comprising:

1) specifying particular processes to be performed in in relation to an end-task;

2) specifying a time constraint for each particular process given in step 1);

3) specifying a list of functional units to be used in the processes specified in step 1);

4) specifying a list of candidate hardware implementations, for each of said functional units, to realize the step 1) processes;

5) specifying an associated cost-measure with each candidate hardware implementation;

6) specifying an associated performance-measure with each candidate hardware implementation; and 7) determining a minimal-cost implementation of the set of functional units which realize the step 1) processes and which satisfy the step 2) through step 6) constraints.

The advantages of the present invention, as defined, may be manifest by way of the following recital as to its applicability to important manufacturing tasks. For example, consideration of our problem and its solution are particularly important in special purpose computers dedicated to specific tasks, for example, the sequential processing of radar data. There, the "registers" actually might be computational units for coordinate transformations, shift registers for data packing and unpacking, and so on, as well as the usual arithmetic registers. The constraint on the sum of the delay times results from the real time demands of the application. Namely, each process must be performed before the acquisition of new data, thereby imposing time bounds upon the computer system.

For a general purpose computer, the term register can be taken to mean the flip-flops comprising a set of registers. The flip-flop type must be specified as part of the design, and the ideal time to do so is immediately after the development of the implementing logic equations. The constraints on processing time, or sum of delays, are to be interpreted as constraints on the particular register operations and transfers (microsteps) comprising the definition of a computer instruction. For example, a multiplication instruction might have the requirement that it be completed within two microseconds. The totality of processes corresponds to the complete set of instructions in a general purpose computer.

BRIEF DESCRIPTION OF THE DRAWINGS

The invention is illustrated in the accompanying drawings, in which.

Figure 1:
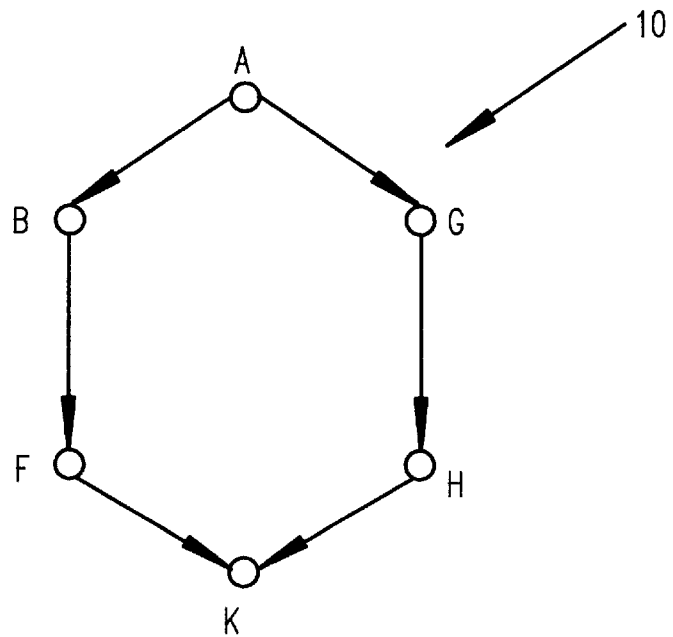
FIGS. 1 & 2 show illustrative graphs of processes used in examples of the present invention.

Note that with respect to FIG. 1, an associated register sequence nationally comprises:

A, (B, F; G,H), K;

while an associated process delay time comprises:

$E(A)+\max\{E(B)+E(F),E(G)+E(H)+E(K)\}$, where $E(X)$ denotes delay time of register x.

Figure 2:
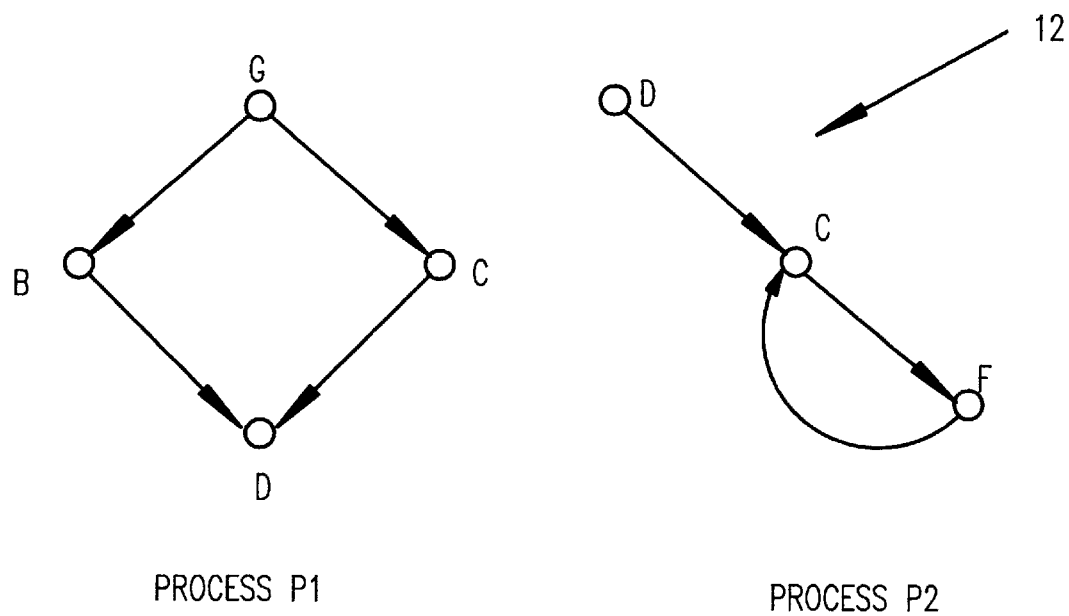

Note that with respect to FIG. 2, an associated register sequence comprises:

$P_1$=G, (B;C), D $P_2$=D, C, F, C while an associated process delay time comprises:

$P_1=E(G)+\max\{E(B), E(C)\}+E(D)$ $P_2=E(D)+2E(C)+E(F)$.

DETAILED DESCRIPTION OF THE INVENTION

THE PERFORMANCE-CONSTRAINED COMPONENT SELECTION PROBLEM Formally, the performance-constraint selection problem can be expressed in the following way.

We are given:

1. A matrix $M=(m_{ij})$, where each row represents a functional unit, and the elements of each row designate particular implementations of the functional unit.
2. A cost function $C(m_{ij})$ defined on each element of M.
3. A performance-time (delay) function, $E(m_{ij})$ defined on each element of M.
4. A set of processes $P_1, P_2, \ldots P_s$, where each Pk consists of a sequence of functional unit names, thereby defining a subsequence of rows in M. These subsequences of rows are not necessarily disjoint.
5. A set of time-tolerances, $t_1, t_2, \ldots, t_s$, associated with the s processes.

We are to select exactly one element out of each row of M, such that $\Sigma C(m_{ij})$ is minimal over selected elements in M subject to $\Sigma(m_{ij}) \leq t_k$ over selected element in rows contained in $P_k$.

AN EXAMPLE

Figure 3:
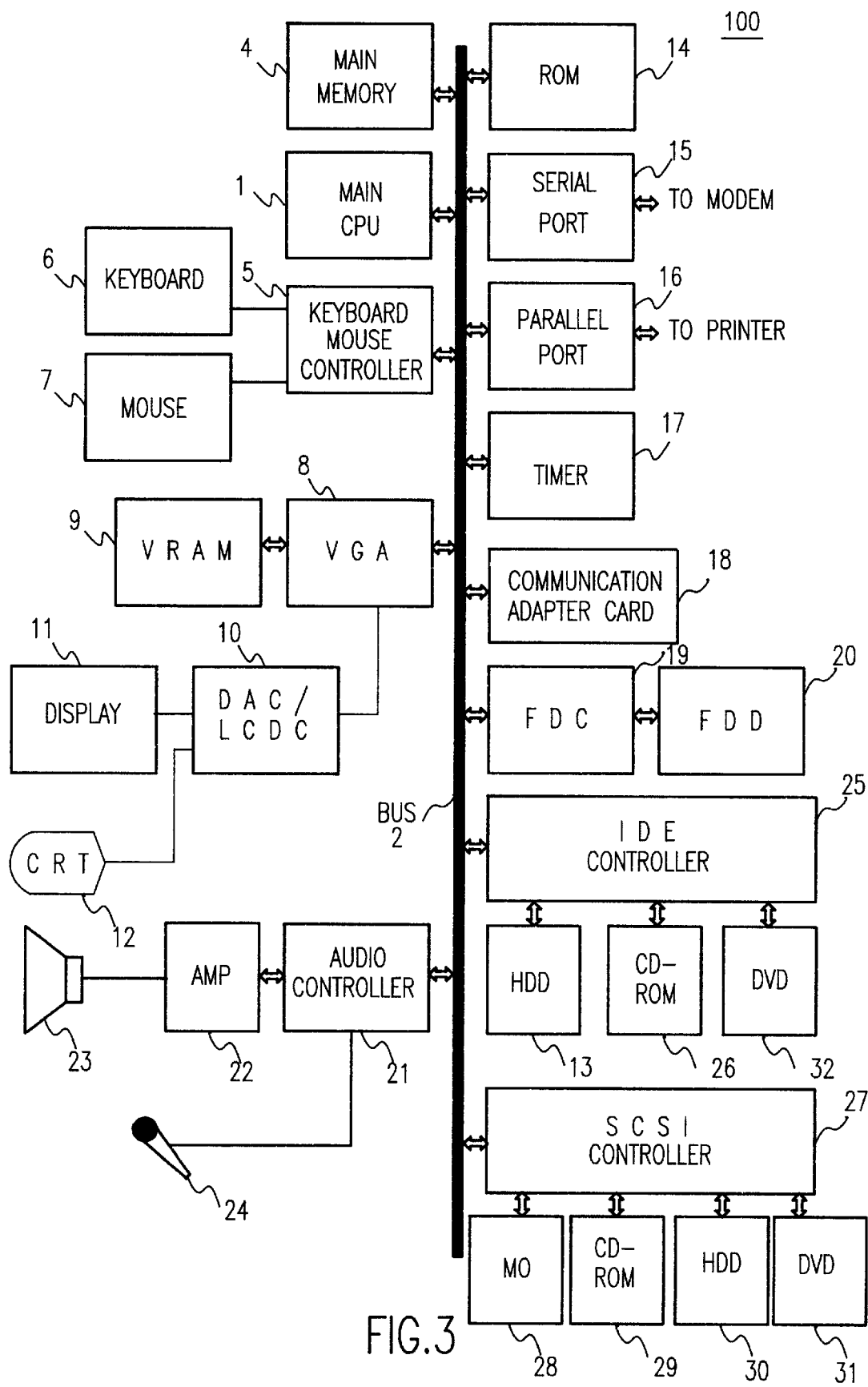
FIG. 3 is block diagram showing an example of a hardware configuration of a system used in the practice of this invention.

In this illustrative problem, which preferably is solved in a computer of the type shown in FIG. 3 preferably programmed in C++, we wish to select components to implement five registers G, B, C, D, F of a computer system that must perform two specific processes, $P_1$ and $P_2$. The graphs of $P_1$ and $P_2$ are given in FIG. 2, numeral 12. The associated "punctuated" register sequence for the processes are $P_1$: G, (B; C), D $P_2$: D, C, F, C The candidate components for implementation of the registers are G: $g_1, g_2$ B: $b_1, b_2$ C: $c_1, c_2$ D: $d_1$ F: $f_1, f_2$ with associated delay times and costs as given in the table below.

| Component-type mij | Cost C(mij) | Delay-time E(mij) |
|---|---|---|
| $m_1 = g_1$ | $a_1$ = $10 | $E(m_1) = 5\ \mu s$ |
| $m_2 = g_2$ | $a_2$ = $5 | $E(m_2) = 10\ \mu s$ |
| $m_3 = b_1$ | $a_3$ = $6 | $E(m_3) = 7\ \mu s$ |
| $m_4 = b_2$ | $a_4$ = $5 | $E(m_4) = 10\ \mu s$ |
| $m_5 = c_1$ | $a_5$ = $30 | $E(m_5) = 3\ \mu s$ |
| $m_6 = c_2$ | $a_6$ = $8 | $E(m_6) = 6\ \mu s$ |
| $m_7 = d_1$ | $a_7$ = $5 | $E(m_7) = 10\ \mu s$ |
| $m_8 = f_1$ | $a_8$ = $30 | $E(m_8) = 3\ \mu s$ |
| $m_9 = f_2$ | $a_9$ = $10 | $E(m_9) = 5\ \mu s$ |

What components should be chosen for a minimal cost implementation of registers G, B, C, D, F subject to the restrictions that processes $P_1$ and $P_2$ not exceed 24 microseconds and 22 microseconds, respectively ?.

The set $M=\{m_1, m_2, \ldots, m_9\}$, where the $m_i$'s are given in the table.

The set $A=\{a_1, a_2, \ldots, a_9\}$, where the $a_i$'s are given in the table.

The set $J=\{j_1, j_2\}$ where $j_1 = g_1b_1c_1d_1+g_1b_1c_2d_1+g_1b_2c_1d_1+g_1b_2c_2d_1+g_2b_1c_1d_1+g_2b_1c_2d_1+g_2b_2c_1d_1+g_2b_2c_2d_1 = m_1m_3m_5d_7+m_1m_3m_6m_7+m_1m_4m_5m_7+m_1m_4m_6m_7+m_2m_3m_5m_7+m_2m_3m_6m_7+m_2m_4m_5m_7+m_2m_4m_6m_7$ and $j_2=d_1c_1f_1+d_1c_1f_2+d_1c_2f_1+d_1c_2f_2=m_7m_5m_8+m_7m_5m_9+m_7m_6m_8+m_7m_6m_9$ The set $R=\{r_1,r_2\}$, where the element $r_k$ is formed by taking the union of each term of $j_k$ in which the sum of the corresponding delay times meet the time restriction of process $P_k$.

Thus, to determine $r_1$ we substitute specific component delay times in the delay expression derived from the register sequence for $P_1$ namely $E_1=E_1(G, B, C, D)=E(G)+\max\{E(B), E(C)\}+E(D)$, and to determine $r_2$ we use the expression $E_2=E_2(D, C, F)=E(D)+2E(C)+E(F)$.

For $r_1$ we evaluate $E_1(m_1m_3m_5m_7)=E(m_1)+\max\{E(m_3), E(m_5)\}+E(m_7)=5+\max\{(7, 3)+10=22 \leq 24$ $E_1(m_1m_3m_6m_7)=E(m_1)+\max\{E(m_3), E(m_6)\}+E(m_7)=5+\max\{7,6\}+10=22 \leq 24$ $E_1(m_1m_4m_5m_7)=E(m_1)+\max\{E(m_4), E(m_6)\}+E(m_7)=5+\max\{10, 3\}+10=25$ $E_1(m_1m_4m_6m_7)=E(m_1)+\max\{E(m_4), E(m_6)\}+E(m_7)=5+\max\{10, 6\}+10=25$ $E_1(m_2m_3m_5m_7)=E(m_2)+\max\{E(m_3), E(m_5)\}+E(m_7)=10+\max\{7, 3\}+10=27$ $E_1(m_2m_3m_6m_7)=E(m_2)+\max\{E(m_3), E(m_6)\}+E(m_7)=10+\max\{7, 6\}+10=27$ $E_1(m_2m_4m_5m_7) = E(m_2)+\max\{E(m_4), E(m_5)\}+E(m_7) = 10+\max\{10, 3\}+10=30$ $E_1(M_2m_4m_6m_7) = E(m_2)+\max\{E(M_4), E(m_6)\}+E(m_7) = 10+\max\{10, 6\}+10 =30$ Thus, $r_1=m_1m_3m_5m_7+m_1m_3m_6$ m.

For $r_2$ we evaluate $E_2(m_7m_5m_8)=E(m_7)+2E(m_5)+E(m_8)=10+2\times3+3=19\leq22$ $E_2(m_7m_5m_9)=E(m_7)+2E(m_5)+E(m_9)=10+2\times3+5=21\leq22$ $E_2(m_7m_6m_8)=E(m_7)+2E(m_6)+E(m_8)=10+2\times6+3=25$ $E_2(m_7m_6m_9)=E(m_7)+2E(m_6)+E(m_9)=10+2\times6+5=27$ Thus, $r_2=m_7m_5m_8+m_7m_5m_9$ Finding the feasable implementation set then formally consists of finding the implicants of $J^x=r_1r_2=(m_1m_3m_5m_7+m_1m_3m_6m_7)(m_7m_5m_8+m_7m_5m_9)$ In this simple illustrative problem, the prime implicants are $m_1m_3m_5m_7m_8$ and $m_1m_3m_5m_7m_9$ with costs consistent with the performance constraints is: $81 and $61 respectively.

Therefore, the minimum cost implementation consistent with the performance constraints is:

$g_1$ to implement G
$b_1$ to implement B
$c_1$ to implement C
$d_1$ to implement D
$f_2$ to implement F with a cost of $61 and delay times of 22 microseconds for $P_1$ and 21 microseconds for $P_2$.

What is claimed:

1. A digital computer for solving performance-constrained component selection, the computer comprising:

1) means for inputting to a central processing unit information comprising:
      (1) a matrix $M=(m_{ij})$, where each row represents a functional unit, and the elements of each row designate a specific implementation of the functional unit;
      (2) a cost function $C(m_{ij})$ defined on each element of M;
      (3) a performance time delay function $E(m_{ij})$ defined on each element of M;
      (4) a set of s processes $P_1, P_2, \ldots, P_s$ where each $P_k$ comprises a sequence of functional units, thereby defining a subsequence of row in M;
      (5) a set of time tolerances $t_1, t_2, \ldots, t_s$, associated with the s processes;

2) means for selecting in the central processing unit exactly one element out of each row of M, such that $\Sigma C(m_{ij})$ is minimal over selected elements in M subject to $\Sigma E(m_{ij})\leq t_k$ over the selected element in rows contained in $P_k$; and 3) means for displaying the information corresponding to the element.

2. A computer-implemented method for solving performance-constrained component selection comprising the steps of:

1) specifying a matrix $M=(m_{ij})$, where each row represents a functional unit and the elements of each row designate a specific implementation of the functional unit;

2) specifying a cost function $C(m_{ij})$ defined on each element of M;

3) specifying a performance time delay function $E(m_{ij})$ defined on each element of M;

4) specifying a set of s processes $P_1, P_2, \ldots, P_s$ processes to be performed in relation to an end-task, where each $P_k$ comprises a sequence of functional units, thereby defining a subsequence of a row in M;

5) specifying a set of time tolerances $t_1, t_2, \ldots t_s$ for each particular process given in step 4);

6) selecting one element out of each row of M, such that $\Sigma C(m_{ij})$ is minimal over selected elements in M subject to $\Sigma E(m_{ij})\leq t_k, k=1, 2, \ldots, s$ over selected elements in rows contained in $P_k$; and 7) displaying the information corresponding to the element.

\* \* \* \* \*